(12) United States Patent
Sterzel et al.

(10) Patent No.: US 7,026,543 B2
(45) Date of Patent: Apr. 11, 2006

(54) PHOTOVOLTAICALLY ACTIVE MATERIALS AND CELLS CONTAINING THEM

(75) Inventors: Hans-Josef Sterzel, Dannstadt-Schauernheim (DE); Klaus Kühling, Mutterstadt (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 519 days.

(21) Appl. No.: 10/227,793

(22) Filed: Aug. 27, 2002

(65) Prior Publication Data

US 2003/0051752 A1 Mar. 20, 2003

(30) Foreign Application Priority Data

Aug. 31, 2001 (DE) ............................... 101 42 632
May 28, 2002 (DE) ............................... 102 23 744

(51) Int. Cl.
*H01L 31/00* (2006.01)
*H01L 31/0248* (2006.01)
*H01L 31/0264* (2006.01)

(52) U.S. Cl. ...................... 136/252; 136/261; 136/264; 136/265

(58) Field of Classification Search ........ 136/243–265; 257/42
See application file for complete search history.

(56) References Cited

U.S. PATENT DOCUMENTS

| | | | | | |
|---|---|---|---|---|---|
| 4,062,706 | A | * | 12/1977 | Ruehrwein | .................... 117/93 |
| 4,710,588 | A | * | 12/1987 | Ellion | .......................... 136/206 |
| 6,384,321 | B1 | * | 5/2002 | Mikoshiba et al. | ......... 136/263 |
| 6,444,894 | B1 | * | 9/2002 | Sterzel | ....................... 136/205 |
| 6,744,110 | B1 | * | 6/2004 | Sterzel et al. | ............... 257/467 |

OTHER PUBLICATIONS

Progress and outlook for high-efficiency crystalline silicon solar cells, Green et al., 9-16, Solar Energy Materials & Solar Cells 65 (2001).

* cited by examiner

*Primary Examiner*—Nam Nguyen
*Assistant Examiner*—Jeffrey T. Barton
(74) *Attorney, Agent, or Firm*—Novak Druce Deluca & Quigg, LLP

(57) ABSTRACT

In a photovoltaic cell having a photovoltaically active semiconductor material constituted by a plurality of metals or metal oxides, the photovoltaically active material is selected from a p- or n-doped semiconductor material constituted by a ternary compound of the general formula (I)

$$Me_x S^A_y S^B_z \qquad (I)$$

with
Me=Al, Ti, Zr, V, Nb, Ta, Cr, Mo, W, Mn, Fe, Co, Ni, Cu or Ag,
$S^A$, $S^B$=B, C, Si, Ge, Sb, Se or Te,
where $S^A$ and $S^B$ respectively come from different groups of the periodic table,
x, y, z are independent of one another and can take values from 0.01 to 1,
and where the proportion by weight of $S^A$ and $S^B$ together is no more than 30%, expressed in terms of the total semiconductor material,
or a mixed oxide of the general formula (II)

$$[(CaO)_u \cdot (SrO)_v \cdot (BaO)_w \cdot (1/2 Bi_2 O_3)_x]_f \cdot \qquad (II)$$
$$\frac{2n+a}{2} \cdot \left( \{k\} \cdot Me^n O_{\frac{n}{2}} \{2-k\} \cdot Me^{n+a} O_{\frac{n+a}{2}} \right)$$

with
Me=Fe, Cu, V, Mn, Sn, Ti, Mo, W
n=integer from 1 to 6,
a=1 or 2,
f=number from 0.2 to 5,
k=number from 0.01 to 2, $u+v+w+x=1$.

16 Claims, No Drawings

PHOTOVOLTAICALLY ACTIVE MATERIALS AND CELLS CONTAINING THEM

The invention relates to photovoltaically active materials and to photovoltaic cells containing them.

Photovoltaic cells have been used for a long time to obtain electrical energy from sunlight. To date, in particular, crystalline silicon solar cells have been used in this context, the efficiency of which it has been possible to improve by more than 50% in the last 15 years. However, the solar cells available to date still have a property spectrum which could be improved.

The currently best commercially available photovoltaic cells have efficiencies of only 17–18%. Purely theoretically, efficiencies of up to 33% are achievable with silicon-based cells. A description of the state of the art in the development of solar cells can be found in M. A. Green et al., Solar Energy Materials & Solar Cells 65 (2001), pages 9–16 and M. A. Green, Materials Science and Engineering B74 (2000), pages 118–124.

The maximum efficiency during the conversion of sunlight into electrical energy is, for thermodynamic reasons, about 93%. Owing to a number of mechanisms, electron-hole pairs that have been separated by photons become recombined, which reduces the efficiency greatly.

The electrons, which are raised by the incident photons from the valence band of the semiconductor into the conduction band, initially still have the extra energy which corresponds to the energy of the photon less the band gap. The energy surplus is gradually lost nonradiatively by collisions with lattice vibrations, which heats the material. Finally, the charge carriers recombine in a statistical fashion with a further loss of efficiency. Taking all the loss mechanisms into account, maximum efficiencies of about 33% can be achieved with silicon as the photovoltaic material.

An essential task in materials research currently consists in finding photovoltaically active materials which exhibit these loss mechanisms to a much lesser extent.

Solutions to this involve materials having a multiplicity of subbands in the valence band structure, which are excited by photons of high to low wavelengths, so as thereby to promote electrons respectively into the conduction band. A multiplicity of subbands is obtained in materials having a complex crystal structure which form, for example, sublattices.

It is also necessary for collisions between electrons and lattice vibrations, i.e. collisions between electrons and phonons, to be avoided as far as possible, in order to avoid the recombination of electrons and holes. The motion of electrons and phonons needs to be decoupled as far as possible.

There is still a need for photovoltaically active materials which have a high efficiency and exhibit a suitable property profile for different application fields. Research in the field of photovoltaically active materials can by no means yet be regarded as concluded, so that there is still a demand for different photovoltaic materials.

It is an object of the present invention to provide photovoltaically active materials and photovoltaic cells containing them, which avoid the disadvantages of existing materials and cells and, in particular, have higher efficiencies.

We have found that this object is achieved by a photovoltaic cell having a photovoltaically active semiconductor material constituted by a plurality of metals or metal oxides, wherein the photovoltaically active material is selected from a p- or n-doped semiconductor material constituted by a ternary compound of the general formula (I)

$$Me_x S^A_y S^B_z \quad (I)$$

with
  Me=Al, Ti, Zr, V, Nb, Ta, Cr, Mo, W, Mn, Fe, Co, Ni, Cu or Ag,
  $S^A$, $S^B$=B, C, Si, Ge, Sb, Se or Te,
  where $S^A$ and $S^B$ respectively come from different groups of the periodic table,
  x, y, z are independent of one another and can take values from 0.01 to 1,
  and where the proportion by weight of $S^A$ and $S^B$ together is no more than 30%, expressed in terms of the total semiconductor material, or a mixed oxide of the general formula (II)

$$[(CaO)_u \cdot (SrO)_v \cdot (BaO)_w \cdot (1/2 Bi_2O_3)_x]_f \cdot$$
$$\frac{2n+a}{2} \cdot \left( \{k\} \cdot Me^n O_{\frac{n}{2}} \{2-k\} \cdot Me^{n+a} O_{\frac{n+a}{2}} \right) \quad (II)$$

with
  Me=Fe, Cu, V, Mn, Sn, Ti, Mo, W
  n=integer from 1 to 6,
  a=1 or 2,
  f=number from 0.2 to 5,
  k=number from 0.01 to 2, preferably from 0.01 to 1.99, e.g. 1

$u+v+w+x=1$.

The photovoltaic cells according to the invention enhance quite generally, on the one hand, the range of available photovoltaic cells. Owing to the different chemical systems, it is possible to satisfy different requirements in various application fields of the photovoltaic cells. The photovoltaic cells according to the invention hence significantly extend the possibilities for application of these elements under different conditions.

The photovoltaic cells contain, besides the photovoltaically active material, preferably optically transparent, electrically conductive cover layers such as indium tin oxide and electrically conductive substrate materials, between which the photovoltaically active material is situated.

The invention relates to semiconductor materials, except for ternary compounds constituted by $AlB_{12}$ and $SiB_6$.

Preferred semiconductor materials will be explained in more detail below.

In the ternary compounds of the general formula (I), $S^A$ and $S^B$ are preferably selected from B, C, Ge, Sb and Te.

In this semiconductor material, Me is preferably selected from one of the following groups:
  1) Al, Ti, Zr.
  2) V, Nb, Ta
  3) Cr, Mo, W
  4) Mn, Fe, Co, Ni
  5) Cu, Ag.

The proportion of doping elements is up to 0.1 atom % in the alloy, or from $10^{18}$ to $10^{20}$ charge carriers per cubic centimeter. Higher charge-carrier concentrations cause disadvantageous recombinations, and hence a reduced charge mobility. The doping is carried out with elements which cause an electron surplus or deficit in the crystal lattice, e.g.

with iodide for n-type semiconductors and alkaline earth elements for p-type semiconductors, so long as a ⅗ or ⅗ semiconductor is present.

A further possible way of doping is obtained if holes or electrons are deliberately introduced into the materials by means of super- or substoichiometric compositions, which obviates the need for an additional doping step.

Dopant elements may also, however, be introduced via aqueous solutions of metal salts, which are subsequently dried in the mixture. The metal cations are then reduced e.g. by hydrogen at elevated temperatures or remain in the material without reduction. Preferably, the p- or n-doping is carried out through selection of the quantitative proportions of the compounds, or the p-doping is carried out with alkali metals and the n-doping with Sb, Bi, Se, C, Te, Br or I (see WO 92/13811).

The materials according to the invention of the general formula (I) are prepared by known methods, the element compounds e.g. by sintering the element powders at high temperatures, but below the melting point, or by melting in a high vacuum and subsequently powdering and sintering or by melting the mixture of element powders and cooling.

In the mixed oxides of the general formula (II), n denotes the oxidation state of the metal Me and f denotes a stoichiometric factor. f has a value in the range from 0.2 to 5, preferably 0.5 to 2, particularly preferably 1. a indicates the difference between the two different oxidation states of Me.

For the stoichiometric factor f, numbers from 0.2 to 0.99, the value 1, numbers from 1.01 to 2 and numbers from 2.01 to 5 may be indicated as preferred ranges.

Each of these cases involves a preferred embodiment of the invention.

k denotes the respective amounts of the oxidation states. The expression in brackets $$\left( \{k\} \cdot Me^n O_{\frac{n}{2}} \cdot \{2-k\} \cdot Me^{n+a} O_{\frac{n+a}{2}} \right)$$

may preferably be, specifically:
FeO//Fe$_2$O$_3$
Cu$_2$O//CuO
VO//V$_2$O$_3$
V$_2$O$_3$//V$_2$O$_5$
VO$_2$//V$_2$O$_5$
VO$_2$//V$_2$O$_3$
MnO//Mn$_2$O$_3$
Mn$_2$O$_3$//Mn$_2$O$_3$
SnO//SnO$_2$
TiO//Ti$_2$O$_3$
Ti$_2$O$_3$ //TiO$_2$
MoO$_2$//MoO$_3$ or
WO$_2$//WO$_3$, especially preferably
FeO.½Fe$_2$O$_3$
½Cu$_2$O.CuO
VO.½V$_2$O$_3$
V$_2$O$_3$.V$_2$O$_5$
VO$_2$.½V$_2$O$_5$
VO$_2$.½V$_2$O$_3$
MnO.½Mn$_2$O$_3$
½Mn$_2$O$_3$.½Mn$_2$O$_3$
SnO.SnO$_2$
TiO.½Ti$_2$O$_3$
½Ti$_2$O$_3$.TiO$_2$
MoO$_2$.MoO$_3$ or
WO$_2$.WO$_3$ The mixed oxides according to the invention are prepared using known methods, preferably by intimate mixing of the individual oxides by known ceramic technologies, pressing the mixtures under pressure to form moldings of, for example, cuboid configuration, and sintering the moldings in an inert atmosphere, e.g. under argon, at temperatures from 900 to 1700° C.

The materials according to the invention are hence prepared by known methods, the element compounds e.g. by sintering the element powders at high temperatures, but below the melting point, or by melting in a high vacuum and subsequently powdering and sintering. The oxides are synthesized e.g. by sintering the powder mixtures of the individual oxides. The expression combinatorial, as used above, refers specifically to this preparation, in particular the sintering.

The photovoltaically active mixed oxides can also be prepared by reactive sintering of the corresponding metal mixtures in air at elevated temperatures. For economic reasons, it is also expedient to use mixtures of oxides and metals.

It is also an object of the invention to optimize the materials in terms of efficiency. It is obvious that, when the components are varied by, for example, 5 atom %, very many materials need to be synthesized and tested. We have found that this object is achieved by combinatorial methods. To that end, element alloys or oxide mixtures or mixtures of elements with oxides, with gradual variation of the composition as a function of the length coordination on a substrate, can be produced by producing the elements or already binary alloys, from appropriate targets, on a substrate provided with a perforated mask, the element composition changing as a function of the distance from the target or as a function of the sputtering angle. The mask is subsequently removed, and the thin-film "dots" which are produced are sintered to form the actual materials. The expression "dot" refers in this case to points or regions of the material which are spatially separated from one another on a substrate, which have essentially the same extents and which are preferably arranged at regular intervals, so that an array is obtained. "Array" means a two-dimensional, essentially uniformly spaced arrangement of dots on a substrate surface. It is also possible to suspend element and oxide powders having particle sizes smaller than 5 μm in an inert suspension medium, such as hydrocarbons, with the participation of a dispersing agent to form sufficiently stable suspensions, and to deposit mixtures of the suspensions as droplets, in the manner described for the oxides, to evaporate the suspension medium and to sinter on the substrate the powder mixtures formed in this way.

Besides metallic substrates, silicon carbide, which is also sufficiently electrically conductive, is preferred as an inert substrate material which is stable with respect to temperature and diffusion.

Thin-film dots of the oxides can be produced on a substrate surface by using doping machines to deposit mixtures of salts, preferably nitrates or other soluble compounds, in the form of drops with variable composition, evaporating the solvent, preferably water, converting the nitrates or compounds into the oxides by raising the temperature and subsequently sintering the oxide mixtures in their entirety.

Per substrate plate with dimensions of the order of 10*10 cm, from 1000 to 10,000 dots with size (diameters) of from 0.2 to 2 mm are applied.

Fast and reliable testing of the materials is essential. According to the invention, the following analysis method may be implemented for this purpose:

The invention relates to a process for the combinatorial preparation and testing of semiconductor materials for photovoltaic cells, in which an array of thin-film dots of the semiconductor materials with different composition is produced on a conductive two-dimensional substrate, the substrate is heat-treated, preferably under an inert gas such as nitrogen or argon, with the array to a desired measurement temperature and the dots are respectively brought into contact with a measurement pin, the voltage without load, the current and the voltage with a decreasing load resistance and/or the short-circuit current being measured under illumination, subsequently stored and evaluated. The illumination may be varied in this case.

For the method, the dots situated on the metallic or silicon-carbide substrate are ground to a uniform height e.g. by using a microfine grinding disk, a plane surface with a small roughness depth being obtained at the same time. The substrate plate is brought to a measurement temperature, and the dots are brought into contact with a measurement pin under a defined application force.

While the measurement pin is being applied, the voltage without load, the current and the voltage with a decreasing load resistance as well as the short-circuit current are measured. Computer controlled measurement equipment requires about 10 seconds in order to measure one material, including travel to the next dot, which makes it possible to measure approximately 10,000 dots per day at one temperature. If the operation is carried out with a plurality of measurement pins in parallel, then a correspondingly larger number of dots can be measured. The measured values and curves can be stored and graphically processed, so that a graphical representation indicates, at a glance, the better materials whose composition is then analyzed using standard methods. Operation is preferably carried out under an inert gas.

The also invention relates to an array of at least 10 different semiconductor materials according to the invention on a conductive substrate.

The materials according to the invention are introduced into modules, as described e.g. in WO 98/44562, U.S. Pat. No. 5,448,109, EP-A-1 102 334 or U.S. Pat. No. 5,439,528, and these modules are connected in series.

We claim:

1. A photovoltaic cell having a photovoltaically active semiconductor material constituted by a plurality of metals or metal oxides, wherein the photovoltaically active material is selected from the group consisting of
    (a) a p- or n-doped semiconductor material constituted by a ternary compound of formula (I)

$$Me_x S^A_y S^B_z \qquad (I)$$

with
    Me=Al, Ti, Zr, V, Nb, Ta, Cr, Mo, W, Mn, Fe, Co, Ni, Cu or Ag,
    $S^A$, $S^B$=B, C, Si, Ge, Sb, Se or Te,
    where $S^A$ and $S^B$ respectively come from different groups of the periodic table,
    x, y, z are independent of one another and can take values from 0.01 to 1,
    and where the proportion by weight of $S^A$ and $S^B$ together is no more than 30%, expressed in terms of the total semiconductor material, and (b) a mixed oxide of formula (II)

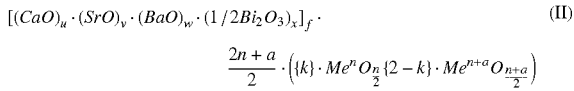

with
    Me=Fe, Cu, V, Mn, Sn, Ti, Mo, or W,
    n=integer from 1 to 6,
    a=1 or 2,
    f=number from 0.2 to 5,
    k=number from 0.01 to 2, $u+v+w+x=1$.

2. The photovoltaic cell as claimed in claim 1, wherein, in the semiconductor material, $S^A$ and $S^B$ are selected from the group consisting of B, C, Ge, Sb and Te.

3. The photovoltaic cell as claimed in claim 1, wherein, in the semiconductor material, of formula 1 Me is selected from the group consisting of Al, Ti and Zr.

4. The photovoltaic cell as claimed in claim 1, wherein, in the semiconductor material, of formula 1 Me is selected from the group consisting V, Nb and Ta.

5. The photovoltaic cell as claimed in claim 1, wherein, in the semiconductor material, of formula 1 Me is selected from the group consisting of Cr, Mo and W.

6. The photovoltaic cell as claimed in claim 1, wherein, in the semiconductor material, of formula 1 Me is selected from the group consisting of Mn, Fe, Co and Ni.

7. The photovoltaic cell as claimed in claim 1, wherein, in the semiconductor material, Me is selected from the group consisting Cu and Ag.

8. The photovoltaic cell as claimed in claim 1, wherein, the photovoltaically active material is the mixed oxide of the formula (II), and f has a value of 0.2 to 0.9, 1, 1.01 to 2, or 2.01 to 5.

9. The photovoltaic cell as claimed in claim 1, wherein the photovoltaically active material is the p- or n-doped semiconductor material constituted by a ternary compound of the formula (I).

10. The photovoltaic cell as claimed in claim 9, wherein $S^A$ and $S^B$ are selected from the group consisting of B, C, Ge, Sb and Te.

11. The photovoltaic cell as claimed in claim 9, wherein Me is selected from the group consisting of Al, Ti and Zr.

12. The photovoltaic cell as claimed in claim 9, wherein Me is selected from the group consisting of V, Nb and Ta.

13. The photovoltaic cell as claimed in claim 9, wherein Me is selected from the group consisting of Cr, Mo and W.

14. The photovoltaic cell as claimed in claim 9, wherein Me is selected from the group consisting of Mn, Fe, Co and Ni.

15. The photovoltaic cell as claimed in claim 9, wherein Me is selected from the group consisting of Cu and Ag.

16. A method for obtaining electrical energy, said method comprising exposing the photovoltaic cell of claim 1 to sunlight.

* * * * *